United States Patent [19]

Belin

[11] Patent Number: 5,907,300
[45] Date of Patent: May 25, 1999

[54] A/D CONVERSION DEVICE WITH DYNAMIC INPUT CONTROL

[75] Inventor: Philippe Belin, Epron, France

[73] Assignee: U.S. Philips Corporation, New York, N.Y.

[21] Appl. No.: 08/956,751

[22] Filed: Oct. 23, 1997

[30] Foreign Application Priority Data

Oct. 25, 1996 [FR] France .................................. 96 13068

[51] Int. Cl.[6] .................................................. H03M 1/10
[52] U.S. Cl. ........................................... 341/155; 341/120
[58] Field of Search .................................... 341/155, 118, 341/120; 327/307, 306; 330/252, 259

[56] References Cited

U.S. PATENT DOCUMENTS 3,708,742  1/1973  Gunn ........................................ 321/15
5,103,230  4/1992  Kalthoff et al. ......................... 341/166
5,754,414  5/1998  Hanington ................................ 363/21
5,825,166  10/1998  Tso et al. ................................. 323/299

Primary Examiner—Marc S. Hoff
Assistant Examiner—Peguy Jean Pierre
Attorney, Agent, or Firm—Steven R. Biren

[57] ABSTRACT

The invention relates to an A/D conversion device having an amplifier (A) which receives an analog input signal (Vin), in which device the voltage level of reference thresholds in the output signal (Vout[0:7]) resulting from the A/D conversion of the input signal (Vin) is maintained constant by means of a regulation module (CMP1, IS), controlling the voltage which is present at the terminals of a storage capacitor (Cs). According to the invention, such a device controls the average DC component of the input signal (Vin) in the purpose of limiting the amplitude of the variations of said signal (Vin), which variations might lead to a saturation of the amplifier (A).

3 Claims, 1 Drawing Sheet

A/D CONVERSION DEVICE WITH DYNAMIC INPUT CONTROL

BACKGROUND OF THE INVENTION

The invention relates to an A/D conversion device having an analog input intended to receive an analog input voltage, a reference input to which a reference voltage must be applied, and a digital output intended to supply a digital signal resulting from the conversion of the analog input voltage, comprising:

- an amplifier having a first input connected to the analog input via a coupling capacitor and to the reference input via a coupling resistor, a second input connected to a power supply terminal via a storage capacitor, and an output intended to supply a signal resulting from the amplification of the difference between the signals received at the first and second inputs,
- an A/D converter having an analog input connected to the output of the amplifier and an output constituting the output of the device,
- a regulation control module comprising a controllable current source connected to the storage capacitor and allowing the voltage at the terminals of said capacitor to be varied, and a first comparator intended to perform the comparison between a predetermined regulation signal and a signal which is representative of the output signal of the amplifier, and to supply a signal allowing control of the conduction of the current source, the regulation module being active when the analog input voltage has a reference threshold.

In a device of this type, the first input of the amplifier receives a voltage whose DC component, referred to as average DC component, is equivalent to an average of the voltage level variations of the reference thresholds in the analog input voltage. The second input of the amplifier receives the voltage at the terminals of the storage capacitor. The difference between said voltage and the average DC component is adjusted in such a way that the output signal of the amplifier has reference thresholds whose voltage levels are constant and determined by the regulation signal. In the case of a variation of the average DC component, the regulation module is used for adjusting the value of the voltage at the terminals of the storage capacitor in such a way that the voltage level of the reference thresholds of the output signal of the amplifier remains unchanged. The amplitude of the variation of the average DC component may be considerable. The instantaneous values of the potentials of the dynamic signals constituting the AC component of the signal at the first input of the amplifier and representing the information which is the object of the conversion have thus a large variation amplitude, which may go beyond the admissible input range of the amplifier and lead to a saturation of this amplifier, thus causing a clipping and loss of information.

SUMMARY OF THE INVENTION

It is an object of the invention to remedy this drawback by providing an A/D conversion device in which the voltage level of the average DC component is subject to a regulation.

According to the invention, a device of this type is characterized in that the device also comprises a second comparator arranged between the reference input and the coupling resistor, which comparator has a first input connected to the reference input, a second input connected to the storage capacitor and an output connected to the coupling resistor.

In this A/D conversion device, the voltage at the terminals of the storage capacitor is equal to the reference voltage in a permanent mode, i.e. when the voltage level of the average DC component and the voltage levels of the reference thresholds of the output signal of the amplifier are constant. The output of the second comparator is then inactive, which means that it does not have a correcting effect on the average DC component. A variation of the average DC component will be rapidly compensated by the regulation module which will impose a variation of the same order on the voltage at the terminals of the storage capacitor so that the difference between the two voltages remains unchanged. As the voltage at the terminals of the storage capacitor becomes different from the reference voltage, the output of the second comparator assumes an active state allowing modification of the value of the voltage at the terminals of the coupling capacitor, which has the effect that the voltage level of the average DC component returns to the value which it had in the permanent mode. The voltage at the terminals of the storage capacitor evolves in a similar manner because of the action of the regulation module, which progressively reduces the magnitude of the correction effected by means of the second comparator. When the permanent mode is re-established, the output of said comparator will become inactive again.

An embodiment of the invention allows simple generation of the regulation signal within the device. An A/D conversion device in accordance with this embodiment is characterized in that, the A/D converter being provided with a resistance ladder which is subject to a given potential difference and supplies, at each junction point between two resistors, a sampling voltage used by the converter for performing a comparison with a signal received at its analog input, the regulation signal is processed on the basis of at least one of said sampling voltages.

The sampling voltages thus provide the possibility of attributing a value to the regulation signal which is taken from a large range established on the basis of pre-existing voltages.

In a variant of this embodiment, an A/D conversion device is characterized in that the regulation signal is one of the sampling voltages.

These and other aspects of the invention are apparent from and will be elucidated with reference to the embodiment described hereinafter.

DESCRIPTION OF THE PREFERRED EMBODIMENTS

Figure 1:
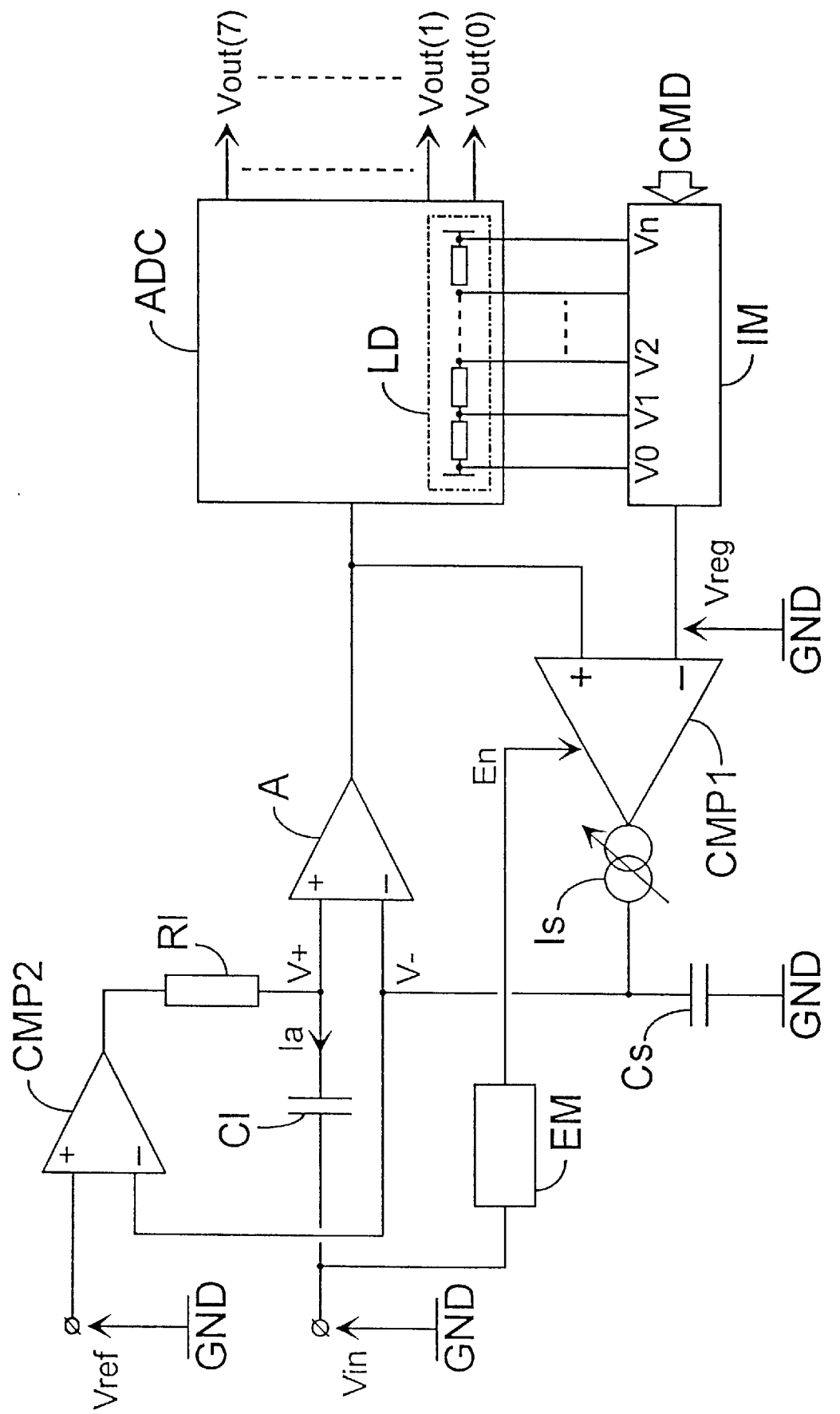
FIG. 1 is a partial functional diagram illustrating an A/D conversion device in accordance with an advantageous embodiment of the invention.

This device has an analog input intended to receive an analog input voltage Vin, a reference input to which a reference voltage Vref must be applied, and a digital output intended to supply a digital signal Vout[0:7] resulting from the conversion of the analog input voltage Vin. This device comprises:

- an amplifier A having a first input connected to the analog input via a coupling capacitor C1 and to the reference input via a coupling resistor R1, a second input connected to a power supply terminal GND via a storage capacitor Cs, and an output intended to supply a signal resulting from the amplification of the difference between the signals received by the amplifier A at its first and second inputs, an A/D converter ADC having an analog input connected to the output of the amplifier A and an output constituting the output of the device, and supplying, in this embodiment, an output signal coded at 8 bits, Vout [0:7], a regulation module comprising a controllable current source Is connected to the storage capacitor Cs and allowing the voltage at the terminals of said capacitor Cs to be varied, and a first comparator CMP1 performing a comparison between a predetermined regulation signal Vreg and a signal which is representative of the output signal of the amplifier, and supplying a signal allowing control of the conduction of the current source Is.

In the herein embodiment described, the A/D converter ADC is provided with a resistance ladder LD which is subject to a given potential difference. This ladder LD supplies, at each junction point between two resistors, a sampling voltage Vi (for i=0 to n) used by the converter ADC for performing a comparison with the signal which it receives at its analog input. The regulation signal Vreg is processed on the basis of these sampling voltages by a module IM controlled by a signal CMD which may originate, for example, from a programmable digital register which is not shown in the FIGURE. Depending on the nature of the regulation signal Vreg which one wishes to obtain, the module IM may assume different forms. If it is desired that the regulation signal Vreg is one of the sampling voltages Vi (for i=0 to 1), the module IM will be constituted by a multiplexer having n+1 data inputs, each receiving one of the sampling voltages, and p selection inputs with $n+1=2^p$, while the control signal CMD is then coded at p bits. If it is desired to obtain a better definition of the value of the regulation signal Vreg, one may attribute to said signal Vreg a value between two successive sampling voltages, Vi and Vi+1 (for i=0 to n−1). This may be realized by incorporating, in the module IM, an interpolation module composed of an interpolation ladder consisting of series-arranged resistors. The end points of this interpolation ladder receive said successive sampling voltages selected by means of the control signal CMD, whose structure is then different from that which it would have in the case of a simple multiplexing as described above. The junction points between two successive resistors of the sampling ladder supply voltages which are intermediate voltages with respect to the sampling voltages, one of these intermediate voltages being selected by means of the control signal CMD for constituting the regulation signal Vreg. Such embodiments are within reach of those skilled in the art and do not depart from the scope of the invention.

In the embodiment shown in FIG. 1, the comparator CMP1 is an analog comparator which compares the output signal of the amplifier A with a regulation signal Vreg of an analog kind. In other embodiments of the invention, it is possible to perform a digital comparison of the output signal of the A/D converter ADC with a digital control signal by means of a comparator of a digital kind whose output controls, in a on-or-off mode, the conductance of the controllable current source Is.

The regulation module can only act on the voltage at the terminals of the storage capacitor Cs when it is activated by an enable signal En. This signal is generated on the basis of the input signal Vin by a detector EM whose function is to identify the reference thresholds in the input signal Vin and to place the signal En in an active state during the period of each of these thresholds, and in an inactive state in the opposite case. The structure of this detector EM is known to those skilled in the art and has not been depicted in the FIGURE.

The device also comprises a second comparator CMP2 arranged between the reference input and the coupling resistor R1. This comparator CMP2 has a first input connected to the reference input, a second input connected to the storage capacitor Cs and an output connected to the coupling resistor R1.

The comparator CMP2 realizes a control of the average DC component whose mode of operation may be described as follows.

In a permanent mode, i.e. when the voltage level of the average DC component corresponding to the value of the DC component of the voltage V+ and the voltage levels of the reference thresholds of the output signal of the amplifier A are constant, the voltage V− at the terminals of the storage capacitor Cs is equal to the reference voltage Vref. The output of the second comparator CMP2 is then inactive, which means that it has no correcting effect on the DC component of the voltage V+. If, for example, the voltage level of the reference thresholds in the analog input voltage Vin decreases to a strong and durable extent, the value of the DC component of the voltage V+ also decreases. This decrease is rapidly compensated by the control module which will impose a decrease of the same order on the voltage V− at the terminals of the storage capacitor Cs so that the difference between the values of the DC component of the voltage V+ and V− remains unchanged. Because of the decrease of the value of V− with respect to Vref, the output of the second comparator CMP2 assumes an active state causing the injection of a current Ia, referred to as extra current, into the coupling capacitor C1 thus enabling modification of the value of the voltage at the terminals of said capacitor C1, with the effect that the value of the DC component of the voltage V+ is increased towards that which it had in the permanent mode. The voltage V− at the terminals of the storage capacitor Cs evolves in a similar manner because of the action of the regulation module, which progressively reduces the magnitude of the correction effected by means of the second comparator CMP2, with the value of the current injected into the coupling capacitor C1 decreasing progressively. When the permanent mode is re-established, the output of the comparator CMP2 becomes inactive again. Such a reasoning is easily transposable to the case where the average DC component would be subject to an increase and the extra current Ia then flowing in the direction opposite to that indicated in the FIGURE when V− exceeds Vref, with the effect of discharging the coupling capacitor C1 and thus decreasing the voltage at its terminals. The variations of the average DC component are thus rapidly corrected by means of a control system realized by the comparator CMP2, which considerably limits the risks of loss of information which might result from a saturation of the amplifier A in the absence of this control system.

What is claimed is:

1. An A/D conversion device having an analog input intended to receive an analog input voltage, a reference input to which a reference voltage must be applied, and a digital output intended to supply a digital signal resulting from the conversion of the analog input voltage, comprising:

an amplifier having a first input connected to the analog input via a coupling capacitor and to the reference input via a coupling resistor, a second input connected to a power supply terminal via a storage capacitor, and an output intended to supply a signal resulting from the amplification of the difference between the signals received at the first and second inputs, an A/D converter having an analog input connected to the output of the amplifier and an output constituting the output of the device, a regulation module comprising a controllable current source connected to the storage capacitor and allowing the voltage at the terminals of said capacitor to be varied, and a first comparator intended to perform a comparison between a predetermined regulation signal and a signal which is representative of the output signal of the amplifier, and to supply a signal allowing control of the conduction of the current source, the regulation module being active when the analog input voltage has a reference threshold, characterized in that the device also comprises a second comparator arranged between the reference input and the coupling resistor, which comparator has a first input connected to the reference input, a second input connected to the storage capacitor and an output connected to the coupling resistor.

2. An A/D conversion device as claimed in claim 1, characterized in that, the A/D converter being provided with a resistance ladder which is subject to a given potential difference and supplies, at each junction point between two resistors, a sampling voltage used by the converter for performing a comparison with a signal received at its analog input, the regulation signal is processed on the basis of at least one of said sampling voltages.

3. An A/D conversion device as claimed in claim 2, characterized in that the regulation signal is one of the sampling voltages.

* * * * *